Feb. 9, 1960 W. H. MANNING, JR 2,924,727
TRANSISTOR POWER SUPPLY
Filed May 27, 1953
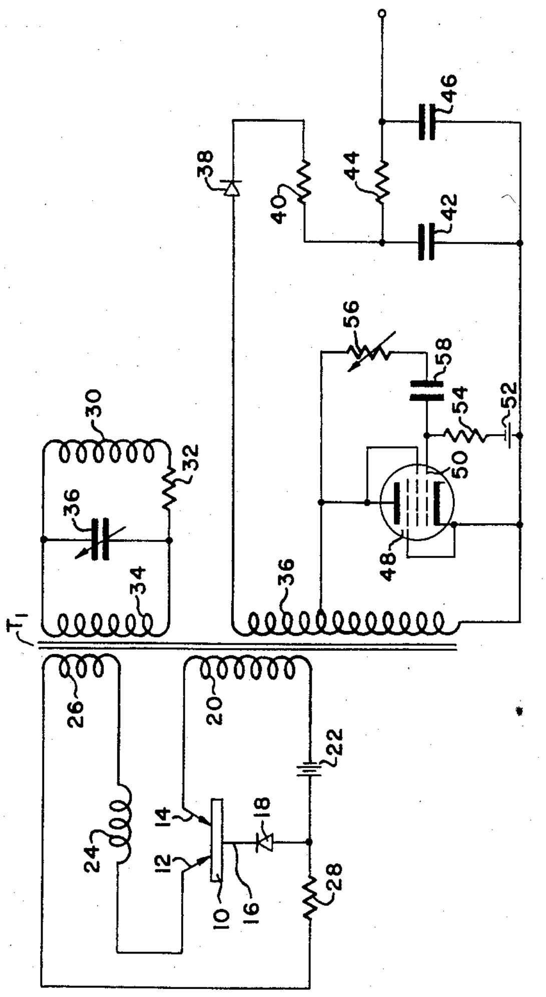
INVENTOR
WALTER H. MANNING JR.
BY
ATTORNEYS 2,924,727

TRANSISTOR POWER SUPPLY

Walter H. Manning, Jr., West Hyattsville, Md., assignor to the United States of America as represented by the Secretary of the Navy Application May 27, 1953, Serial No. 357,938

1 Claim. (Cl. 307—150)

(Granted under Title 35, U.S. Code (1952), sec. 266)

The invention described herein may be manufactured and used by or for the Government of the United States of America for governmental purposes without the paymetn of any royalties thereon or therefor.

This invention relates to oscillators and more particularly to oscillation generators including a semi-conductor device.

It is known to those skilled in the art that some three-electrode semi-conductor amplifiers exhibit both current and voltage amplification properties. These semi-conductor amplifiers include a small block of semi-conductor material such as germanium having an emitter electrode, a collector electrode and a base electrode. The emitter and collector electrodes may be point contact electrodes making rectifier contact with the block, the base electrode providing a large area, low resistance contact with the block. The emitter may be biased for conduction in the forward direction in which case its impedance is of a relatively low value and the collector biased for conduction in the reverse direction in which case its impedance is of a relatively higher value. Thus, voltage amplification is achieved when signal charges are introduced into the block through the low impedance of the emitter and are withdrawn through the high impedance of the collector. Additionally, the charges introduced at the emitter modify the current flow from the base electrode to the collector electrode thereby producing current amplification.

By feeding back a portion of the output voltage in proper phase to the emitter, the semi-conductor amplifier device can be caused to oscillate at a frequency determined by the external circuit components.

The present invention utilizes the current amplifying characteristic of semi-conductor amplifiers to facilitate starting of the oscillator under load conditions. A non-linear impedance is provided in the base lead, which impedance has non-linear resistance characteristics such that a high effective impedance is presented when the collector curent is near or at zero and a low effective impedance is presented when an appreciable collector current flows. Since, in a current amplifying semi-conductor amplifier, the signal frequency collector current exceeds the signal frequency emitter current, the non-linear impedance in the base lead produces a current controlled regenerative feedback which aids the starting of the oscillator, which current controlled feedback is reduced to a low value after oscillations begin.

The semi-conductor oscillator of the present invention is utilized to provide a regulated high D.-C. voltage and also to provide a regulated A.-C. voltage from the low voltage collector bias supply. The A.-C. load which comprises part of the oscillator tank circuit is transformer coupled to the oscillator as is the high voltage output winding. A peak clipping voltage regulator is connected in shunt with the high voltage winding to thereby regulate both the high voltage output and the A.-C. voltage applied to the A.-C. load in the tank circuit.

An important object of this invention is to provide a semi-conductor oscillator which supplies a regulated high voltage output from a low voltage collector bias supply.

Another object of this invention is to facilitate the starting of an external feedback type semi-conductor oscillator.

A further object of this invention is to introduce current-controlled regenerative feedback to aid in starting the external feedback oscillator and reduce the current feedback as the collector current increases.

Other objects and many of the attendant advantages of this invention will be readily appreciated as the same becomes better understood by reference to the following detailed description when considered in connection with the accompanying drawing wherein the solitary figure is a schematic diagram of the semi-conductor oscillator.

Reference is now made more specifically to the drawing. The semi-conductor amplifier referred to in the art as a "transistor" comprises a block 10 of semi-conductor material such as high back voltage germanium having an emitter electrode 12, a collector electrode 14 and a base electrode 16. The emitter and collector electrodes are preferably point contact electrodes which make rectifier contact with the block 10, the base electrode providing a large area low resistance contact with the block.

In accordance with the present invention, a non-linear impedance 18 having negative resistance characteristics is provided in the base lead, which impedance may comprise a rectifier having characteristics such that the forward resistance thereof decreases as the current flow therethrough increases. Thus, a high effective resistance is presented in the base lead when the current flow through the non-linear impedance is low, and a low impedance is presented when the current flow through the impedance is relatively high.

The collector electrode 14 is connected in a series circuit with the primary 20 of transformer $T_1$, the D.-C. supply source such as the battery 22 and the non-linear impedance 18 to the base electrode 16. The emitter electrode 12 is connected in a series circuit with the inductance 24, secondary feedback winding 26 of transformer $T_1$, resistor 28 and non-linear impedance 18 to the base electrode 16.

The block 10 may be either PNP or NPN type semi-conductor material. In either case the emitter electrode is operated in the forward or low impedance direction while the collector is biased to operate in the reverse or high impedance direction. In particular, for N type germanium, the battery 22 is polarized so that the collector 14 electrode is negative with respect to the base electrode 16 and the emitter electrode 12 is normally operated at a slight positive potential with respect to the base electrode 16 by a separate D.-C. bias source. However, in the present invention no separate emitter bias source is necessary, the self biasing effect produced by the collector current flowing through the non-linear impedance 16 and the internal base resistance of the transistor serving to drive the emitter in the forward direction.

The inductor 24 is provided to improve the wave shape, the inductance thereof being chosen to afford a high impedance to harmonics of the fundamental oscillator frequency. Resistor 28 is provided to limit the flow of emitter current.

The oscillator tank circuit comprising inductance 30, resistor 32 and capacitor 36 is coupled to the oscillator by the secondary winding 34 on transformer $T_1$, which tank circuit determines the frequency at which the oscillator will oscillate. It is contemplated that the oscillator be utilized to drive an A.C. load, which load may conveniently comprise the inductance 30 or a similar reactive load.

Additionally, the oscillator is utilized to supply a regulated D.-C. voltage. For this purpose the output voltage appearing across the secondary winding 36 is applied through a rectifier 38 to a two stage R-C filter comprising resistor 40, condenser 42, resistor 44 and condenser 46, the filtered D.-C. output appearing across condenser 46.

Regulation of the D.-C. output voltage and the A.-C. voltage supplied to the load 30 is achieved by a peak-clipping voltage regulator such as the tube 48. The plate-cathode path of the tube 48 is connected in shunt with a portion of the secondary winding 36, and a negative bias is applied to the grid 50 of the tube by bias source 52 through resistor 54. The voltage applied to the plate of tube 48 is also applied through variable resistor 56 and condenser 58 to the grid 50. The bias source 52 normally maintains the tube 48 below cutoff, the resistor 56 being adjusted so that the tube is rendered conducting for a portion of each cycle of the oscillator output. Thus, the tube 50 serves to clip the positive peaks of the A.-C. voltage appearing across secondary winding 36, thereby regulating the D.-C. output voltage. Additionally, since the A.-C. load is coupled to the transformer $T_1$, the reflected plate-cathode impedance of tube 48 appears as an effective variable shunt across the A.-C. load whereby the voltage applied to the A.-C. load is also regulated.

The semi-conductor oscillator thus supplies a regulated output voltage to both the A.-C. load and to the high voltage D.-C. power supply from the relatively low voltage collector bias supply. Starting of the oscillator under load conditions is facilitated by the non-linear impedance 18 in the base lead of the semi-conductor oscillator which impedance provides regenerative feedback.

Obviously many modifications and variations of the present invention are possible in the light of the above teachings. It is therefore to be understood that within the scope of the appended claim the invention may be practiced otherwise than as specifically described.

What is claimed as new and desired to be secured by Letters Patent of the United States is:

A multiple load supply comprising a transistor having emitter, collector and base electrodes, a transformer having a multiplicity of windings, a first circuit path including a first one of said windings interconnecting said emitter and base electrodes, a second circuit path including a second one of said windings interconnecting said collector and base electrodes, a unidirectional potential source included in said second path for biasing said collector electrode in the reverse direction and said emitter electrode in the forward direction thereby initiating the flow of current through said transistor, said first and second windings being so poled as to sustain an alternating current flow through said transistor, a resistance and inductance serially connected in said first circuit path, an asymmetrically conductive device common to both of said circuit paths for providing a substantial regenerative current feedback during the initial period of current flow and a relatively unsubstantial regenerative feedback thereafter, a tank circuit connected across a third one of said windings for regulating the frequency of said alternating current flow, first output circuit means connected to said tank circuit for coupling the alternating current flow therein to an A.C. load, second output circuit means coupled across a fourth one of said windings for applying unidirectional energy to a D.C. load from the alternating current flow through said transistor, and circuit means coupled across a portion of said fourth winding for regulating the magnitude of the energy simultaneously being applied to the A.C. and D.C. loads, said circuit means including a normally non-conducting electron tube adapted to being rendered conductive by a preselected magnitude of the alternating current flow in said transformer.

References Cited in the file of this patent

UNITED STATES PATENTS

| | | |
|---|---|---|
| 2,175,694 | Jones | Oct. 10, 1939 |
| 2,465,903 | McLamore | Mar. 29, 1949 |
| 2,475,063 | Thalner | July 5, 1949 |
| 2,556,286 | Meacham | June 12, 1951 |
| 2,612,632 | Ayres | Sept. 30, 1952 |
| 2,622,211 | Trent | Dec. 16, 1952 |
| 2,629,833 | Trent | Feb. 24, 1953 |
| 2,629,834 | Trent | Feb. 24, 1953 |
| 2,757,243 | Thomas | July 31, 1956 |